United States Patent
Matsumoto (10) Patent No.: US 7,564,695 B2
(45) Date of Patent: Jul. 21, 2009

(54) CIRCUIT CONNECTION STRUCTURE AND PRINTED CIRCUIT BOARD

(75) Inventor: Shoji Matsumoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/144,595

(22) Filed: Jun. 23, 2008

(65) Prior Publication Data

US 2009/0016031 A1    Jan. 15, 2009

(30) Foreign Application Priority Data

Jul. 9, 2007 (JP) .............................. 2007-179174
May 26, 2008 (JP) .............................. 2008-136683

(51) Int. Cl.
*H05K 9/00* (2006.01)

(52) U.S. Cl. .................. 361/794; 361/772; 361/818; 361/799; 361/777; 174/261; 333/33; 333/32; 333/34; 333/12; 257/775

(58) Field of Classification Search ................ 361/772, 361/777, 792, 795, 799, 816, 818, 803; 174/261, 174/350; 333/32, 33, 34; 257/775
See application file for complete search history.

(56) References Cited

U.S. PATENT DOCUMENTS

| | | | | |
|---|---|---|---|---|
| 3,093,805 A | * | 6/1963 | Osifchin et al. ................ | 333/1 |
| 4,283,694 A | * | 8/1981 | Pauker ......................... | 333/34 |
| 4,543,544 A | * | 9/1985 | Ziegner ........................ | 333/34 |
| 5,200,719 A | * | 4/1993 | Margulis et al. ............... | 333/34 |
| 5,397,862 A | * | 3/1995 | Bockelman et al. .......... | 174/250 |
| 6,239,761 B1 | * | 5/2001 | Guo et al. .................... | 343/767 |
| 6,556,099 B2 | * | 4/2003 | Khan et al. ................... | 333/34 |
| 6,639,487 B1 | * | 10/2003 | Salmela et al. ................ | 333/34 |
| 6,646,518 B2 | * | 11/2003 | Tajima ........................ | 333/26 |
| 6,876,085 B1 | * | 4/2005 | Handforth et al. ........... | 257/775 |
| 7,348,865 B2 | * | 3/2008 | Carvalho et al. ............. | 333/33 |
| 2006/0197625 A1 | * | 9/2006 | Kashiwakura ............... | 333/33 |
| 2007/0126524 A1 | * | 6/2007 | Yagisawa ..................... | 333/33 |

FOREIGN PATENT DOCUMENTS

| | | |
|---|---|---|
| JP | 2005-340506 | 12/2005 |
| JP | 2006-173239 | 6/2006 |

* cited by examiner

*Primary Examiner*—Dameon E Levi
(74) *Attorney, Agent, or Firm*—Fitzpatrick, Cella, Harper & Scinto (57) ABSTRACT

While gradually increasing the widths of signal lines (104*a*, 104*b*, 105*a*, 105*b*) of first and second groups of differential signal lines (104, 105) to suppress attenuation in the lines, the opening widths of slits (104*s*, 105*s*) formed in a GND layer (102) below the differential signal lines are similarly changed. Thereby, impedance matching is realized. Further, by alternately disposing a large-width side and a small-width side of the two groups of differential signal lines (104, 105), the total wiring area widths are reduced.

7 Claims, 12 Drawing Sheets

CIRCUIT CONNECTION STRUCTURE AND PRINTED CIRCUIT BOARD

BACKGROUND OF THE INVENTION

1. Field of the Invention

The present invention relates to a printed wiring board for transmitting a digital signal at high speed.

2. Related Background Art

In the printed wiring board, a DC resistance component of a wiring conductor attenuates a signal by nature, thereby adversely affecting transmitted waveform quality. Accordingly, the longer a transmission signal line, the larger the attenuation, which results in reduction in signal integrity. In recent years, it has been found that in the case of a signal of a frequency band of 1 GHz or more, the influence of a skin effect or a dielectric loss is extremely large, and signal attenuation is much greater. Thus, in the signal transmission of a gigahertz order in the printed wiring board, the signal attenuation is one of the problems to be solved to secure signal integrity.

Figure 13A:
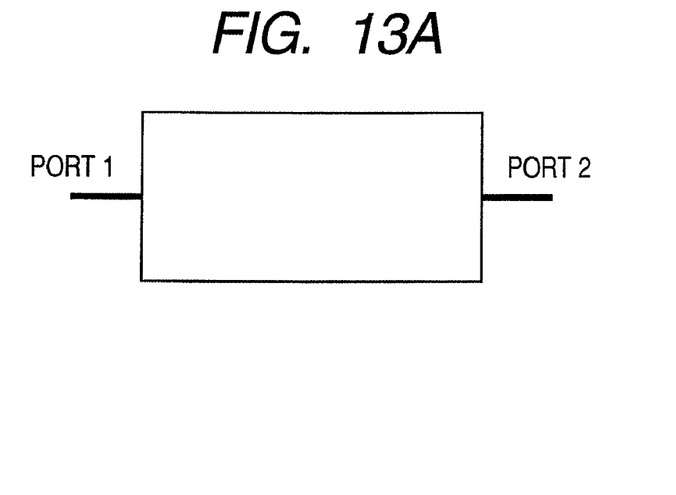
FIGS. 13A and 13B are a schematic view and a graphical representation explaining transmission characteristic S21.

As one of indexes to evaluate signal attenuation, a transmission characteristic S21 parameter is known. The transmission characteristic S21 parameter is obtained by constructing a network for a transmission line as illustrated in FIG. 13A, and digitizing a rate (transmittance) of a signal transmitted from an input port (port 1) to an output port (port 2) of the network in this case. A digitized rate (transmittance) of a signal transmitted from an input port (port 2) to an output port (port 1) of the network is a transmission characteristic S12 parameter.

Figure 13B:
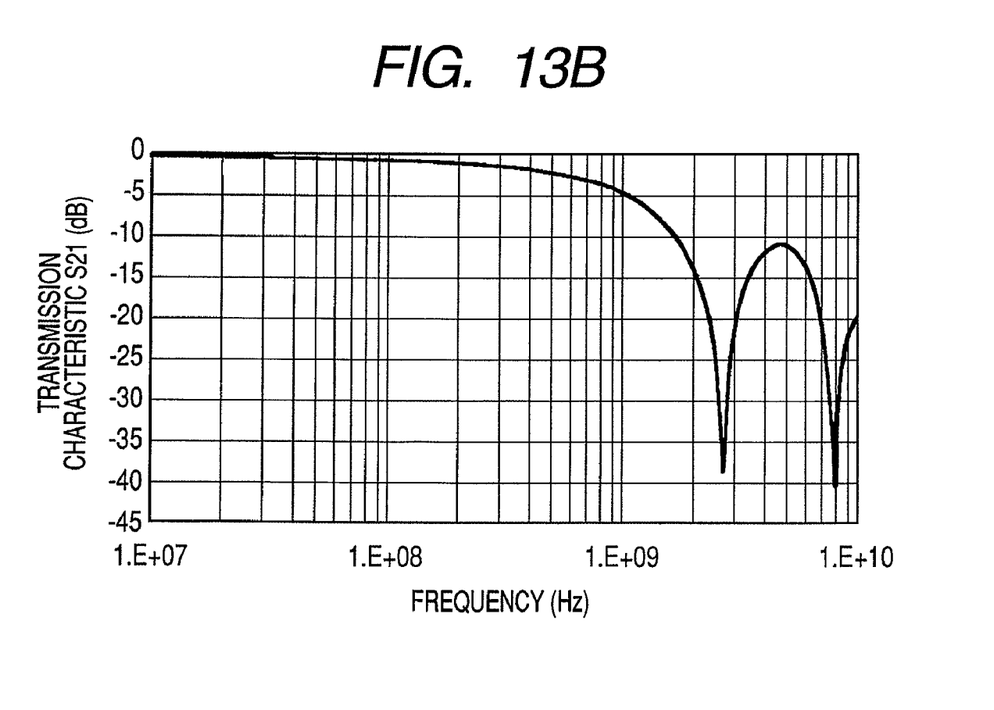

A relation between a frequency and attenuation of a signal to be transmitted will be described by using the transmission characteristic S21. FIG. 13B illustrates an example of general transmission characteristic S21 of a signal transmitted through a signal line provided in a printed wiring board. In FIG. 13B, the ordinate indicates transmission characteristic S21 (dB) of an S parameter, and the abscissa indicates a frequency (Hz) of a signal to be transmitted. In a frequency band of 1 GHz or less, attenuation caused by DC resistance of a wiring conductor is predominant, and attenuation gradually increases as the frequency becomes higher. This phenomenon is due to a skin effect or a dielectric loss of a high-frequency signal. Especially, in a frequency band of 1 GHz or more, because a loss caused by a skin effect or a dielectric loss is larger than a DC loss, the attenuation drastically increases. Further, large attenuation is observed at specific frequencies, which is due to resonance between inductance and capacitance components of the wiring conductor.

Causes of a reduction in signal integrity include not only signal attenuation but also impedance mismatching of a line. In other words, when mismatching occurs in impedance of the line, the transmitted signal is repeatedly reflected at the mismatching point to greatly reduce the signal integrity. Impedance mismatching greatly fluctuates depending on changes not only in connection point of the lines but also in width of the line, an interval with another line, and a dielectric constant around the line. An ordinary printed wiring board is designed such that, for example, the impedance characteristics are unified at 50Ω in a single ended line and at 100Ω in differential lines.

An impedance (Zo) of a line of a microstrip line structure can be calculated by the following (Equation 1):

$$Zo=60/\sqrt{(0.475\times\epsilon r+0.67)}\times\ln(4\times h/(0.67\times(0.8\times W+t)))$$ (Equation 1)

In Equation 1, $\epsilon r$ is a dielectric constant of a dielectric layer of the printed wiring board which is a lower layer of the wiring layer, h is a thickness of an insulating layer from a GND layer to the wiring layer, W is a width of the line, and t is a thickness of the line.

When the line is a differential signal line, a differential impedance (Zdiff) can be calculated by the following (Equation 2):

$$Zdiff \approx 2\times Zo(1-0.48\times\exp(-0.96\times S/h))$$ (Equation 2)

In Equation2, h is a thickness from the GND layer to the wiring layer, and S is a spacing between two lines constituting a differential line.

Further, an impedance (Zo) of a stripline structure can be calculated by the following (Equation 3):

$$Zo=60/\sqrt{(\epsilon r)}\times\ln(4\times h/(0.67\times(0.8\times W+t)))$$ (Equation 3)

In Equation 3, $\epsilon r$ is a dielectric constant of a dielectric layer of a printed wiring board which is a lower layer of the wiring layer, W is a width of the line, and t is a thickness of the line.

When the line is a differential signal line, a differential impedance (Zdiff) can be calculated by the following (Equation 4):

$$Zdiff \approx 2\times Zo(1-0.374\times\exp(-2.9\times S/h))$$ (Equation 4)

In Equation 4, h is a spacing between two GND layers sandwiching the line, and S is a spacing between two lines constituting the differential line.

Japanese Patent Application Laid-Open No. 2006-173239 proposes measures against impedance mismatching caused by a change in line width. This patent document describes a structure when a line of a printed wiring board is connected to a connector. Because the land size of the connector is set larger than the line width, the line width of a portion near the land is set large to match the land size of the connector. In this case, impedance mismatching caused by the enlarged line width is suppressed by setting thick a lower dielectric layer of the portion with the enlarged line width.

Japanese Patent Application Laid-Open No. 2005-340506 describes a method of correcting impedance mismatching by changing a line width. This patent document describes a differential signal line which includes a first line and a second line for interconnecting driver and receiver elements mounted on a printed wiring board. The first line and the second line are connected to each of electrode terminals of the driver and receiver elements. In this case, the spacing between the electrode terminals is set larger than widths of the first line and the second line. Accordingly, the first line and the second line are connected to each of the electrode terminals by gradually increasing, near the electrode terminals, the spacing between the first line and the second line provided in parallel. Impedance mismatching caused by the enlarged spacing between the first line and the second line is suppressed by increasing the widths of the first line and the second line as the spacing between the first line and the second line increases.

As measures to suppress a reduction in signal integrity caused by signal attenuation which occurs due to a DC resistance component of a wiring conductor, enlargement of line width has hitherto been known. By enlarging the line width, a transmission sectional area of a signal is enlarged to enable reduction of the DC resistance component.

However, the enlarged line width reduces impedance characteristics of the line. The reduced impedance characteristics cause impedance mismatching, thereby reducing the signal integrity.

The impedance characteristics are enhanced by widening the spacing between lines. Accordingly, when a line width is set large, impedance characteristics can be set to a predetermined value by widening the spacing between the lines. However, when the spacing between lines is widened, a wiring area on a printed wiring board is increased, and terminal widths of a semiconductor package and a connector to which the lines are connected need to be set large. This has been a big obstacle to size reduction of printed wiring boards and semiconductor packages in recent years.

SUMMARY OF THE INVENTION

It is, therefore, an object of the present invention to provide a printed wiring board which secures signal integrity by suppressing signal attenuation and impedance mismatching without enlarging a wiring area of the printed wiring board.

The printed wiring board according to the present invention includes a differential signal wiring layer in which at least two groups of differential signal lines are disposed in parallel, and a GND layer disposed below the differential signal wiring layer through an insulating layer. The at least two groups of differential signal lines interconnect a first region and a second region of the printed wiring board.

Two lines which constitute one group of the groups of differential signal lines are reduced in width at equal rates from the first region toward the second region, and a spacing between the two lines is constant. Another group of the groups of differential signal lines is disposed adjacent the one group of differential signal lines. Two lines which constitute the another group of differential signal lines are increased in width at equal rates from the first region toward the second region, and a spacing between the two lines is constant. The GND layer has a first slit which is formed below the one group of differential signal lines and is reduced in opening width from the first region toward the second region, and a second slit which is formed below the another group of differential signal lines and is increased in opening width from the first region to the second region.

Further features of the present invention will become apparent from the following description of exemplary embodiments with reference to the attached drawings.

DESCRIPTION OF THE EMBODIMENTS

The exemplary embodiments of the present invention will be described below referring to the accompanying drawings.

First Embodiment

Figure 1:
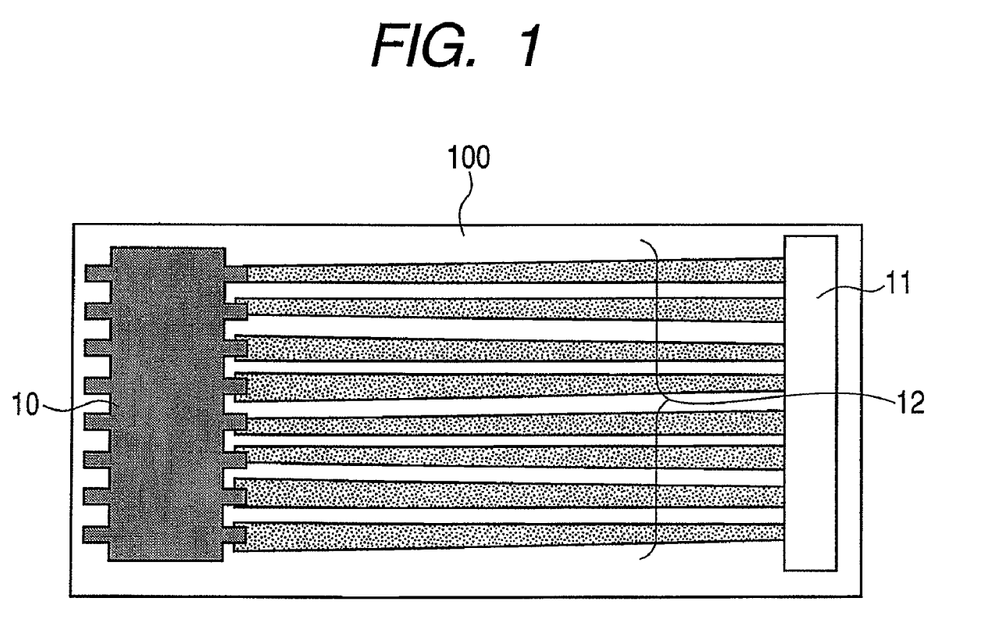
FIG. 1 is a plan view illustrating a printed circuit board according to First Embodiment.

FIG. 1 is a schematic view illustrating a printed circuit board which includes electronic components mounted on a printed wiring board according to First Embodiment. In FIG. 1, the printed circuit board includes a printed wiring board 100, a semiconductor package 10, a connector 11, and a plurality of differential signal lines 12 for connecting the semiconductor package 10 to the connector 11. The semiconductor package 10 is mounted in a first region and the connector 11 is mounted in a second region.

The printed wiring board according to the present embodiment includes at least a signal wiring layer and a GND layer stacked together via an insulating layer.

Figure 2A:
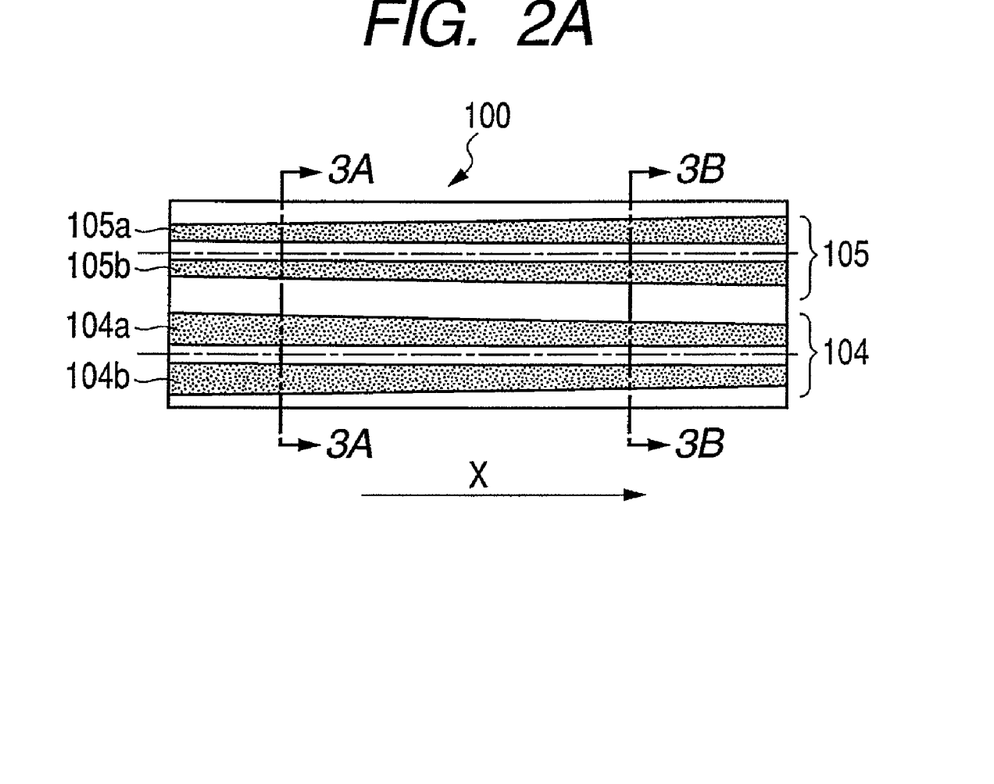
FIGS. 2A and 2B are plan views illustrating a printed wiring board according to Example 1.
Figure 2B:
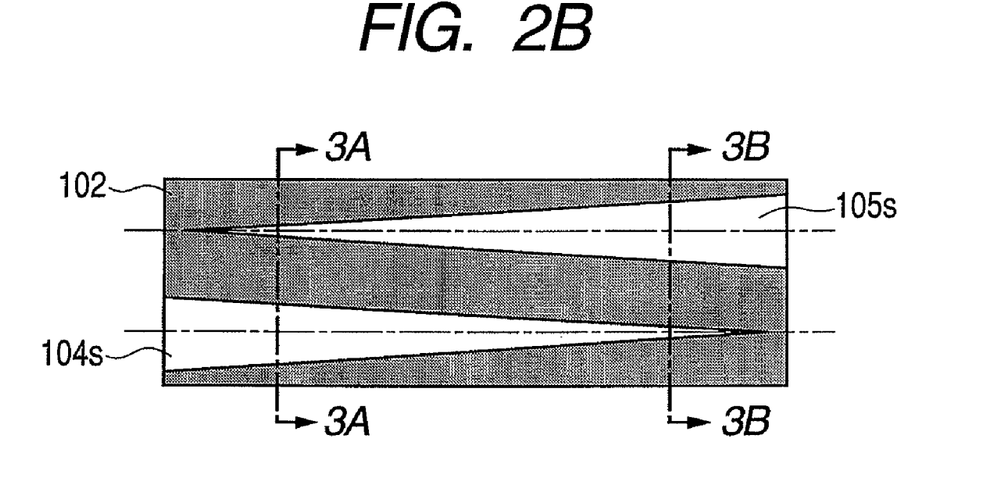
Figure 3A:
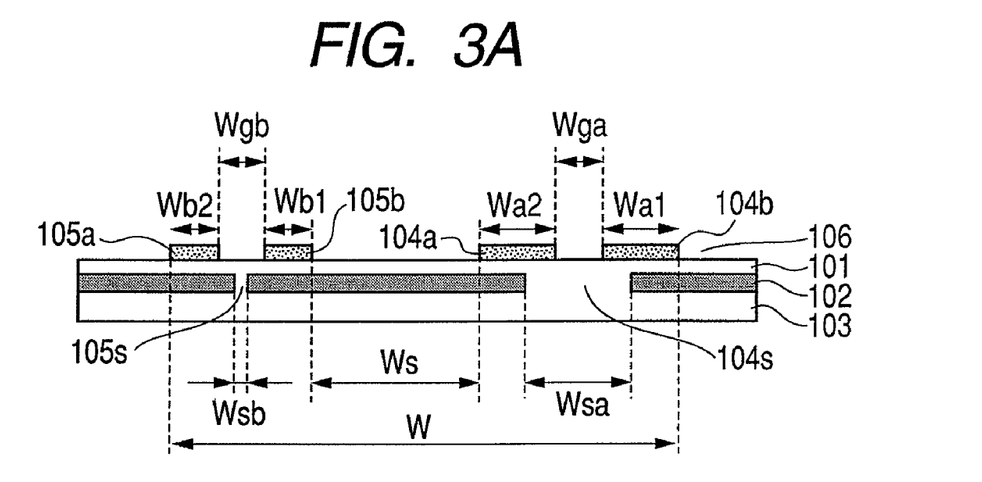
FIGS. 3A and 3B are cross-sectional views illustrating the printed wiring board of Example 1.
Figure 3B:
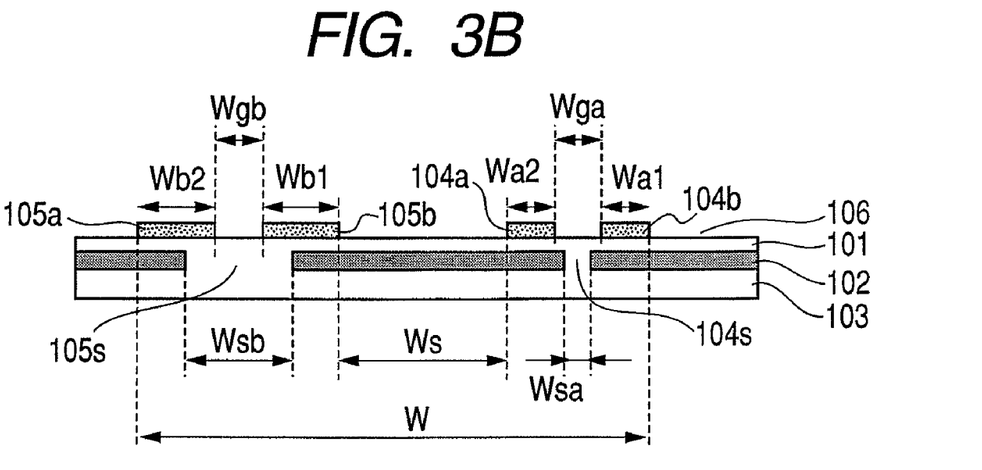

FIGS. 2A and 2B and FIGS. 3A and 3B illustrate, among the differential signal lines 12 illustrated in FIG. 1, two groups (or pairs) of differential signal lines in detail. FIG. 2A is a plan view of the printed wiring board when seen from above, and FIG. 2B is a plan view of the GND layer. FIGS. 3A and 3B are cross-sectional views of the printed wiring board 100 taken along lines 3A-3A and 3B-3B in FIGS. 2A and 2B, respectively.

The printed wiring board 100 has a structure in which an insulating layer 103, a GND layer 102, an insulating layer 101, and a differential signal wiring layer 106 are stacked together. The signal wiring layer 106 includes differential signal lines 104 and 105 disposed in parallel. The differential signal lines 104 include two lines 104a and 104b, and the differential signal lines 105 include two lines 105a and 105b.

As illustrated in FIG. 3A, the lines 104a and 104b have line widths Wa1 and Wa2, and a spacing Wga therebetween. The lines 105a and 105b have line widths Wb1 and Wb2, and a spacing Wgb therebetween. The differential signal lines 104 and 105 have a spacing Ws therebetween, and a entire width W.

In FIG. 2A, the widths of the lines 104a and 104b are reduced at equal rates in a direction indicated by an arrow X, and always equal to each other at respective locations in the arrow X direction. The spacing Wga between the lines 104a and 104b is always constant irrespective of the widths of the lines 104a and 104b.

Similarly, the line widths Wb1 and Wb2 of the lines 105a and 105b are increased at equal rates in the arrow X direction, and always equal to each other at respective locations in the arrow X direction. The spacing between the lines 105a and 105b is always constant irrespective of the widths of the lines 105a and 105b.

If signals with the same characteristics are transmitted through the differential signal lines 104 and 105, the width reduction rate of the lines 104a and 104b in the arrow X direction and the width increase rate of the lines 105a and 105b in the arrow X direction can be set identical to each other. Accordingly, the spacing Ws between the differential signal lines 104 and 105 and the entire width W of the differential signal lines 104 and 105 can each be set to be constant, thereby minimizing the wiring area.

The GND layer 102 illustrated in FIG. 2B has slits 104s and 105s formed directly below the differential signal lines 104 and 105. The term "slit" herein employed refers to an area in which a conductor for constituting the GND is not provided. As illustrated in FIG. 2A, the lines 104 are larger in width in a direction opposite to the arrow X direction, while the lines 105 is larger in width in the arrow X direction. A larger line width normally reduces the impedance characteristics. According to the present invention, however, by disposing the slits in the GND layer below the wiring layer, reduced impedance characteristics are cancelled.

The slit 104s has a slit width Wsa, and the slit 105s has a slit width Wsb. As the line widths Wa1 and Wa2 of the line 104a and the line 104b shown in FIGS. 2A and 3a become smaller in the arrow X direction, the slit width Wsa of the slit 104s is gradually reduced. In other words, the slit width Wsa taken along the 3A-3A cross section shown in FIG. 3A is larger than that taken along the 3B-3B cross section shown in FIG. 3B. Further, as the line widths Wb1 and Wb2 of the line 105a and the line 105b shown in FIGS. 2A and 3A become larger in the arrow X direction, the slit width Wsb of the slit 105s is gradually increased. In other words, the slit width Wsb taken along the 3A-3A cross section shown in FIG. 3A is smaller than that taken along the 3B-3B cross section shown in FIG. 3B.

Figure 4A:
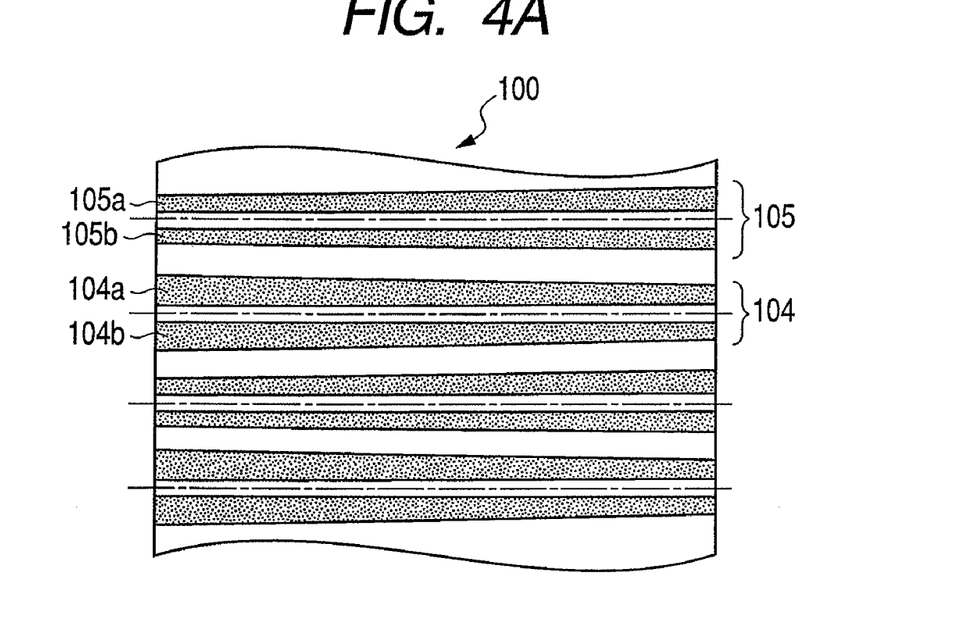
FIGS. 4A and 4B are plan views illustrating a printed wiring board according to First Embodiment.
Figure 4B:
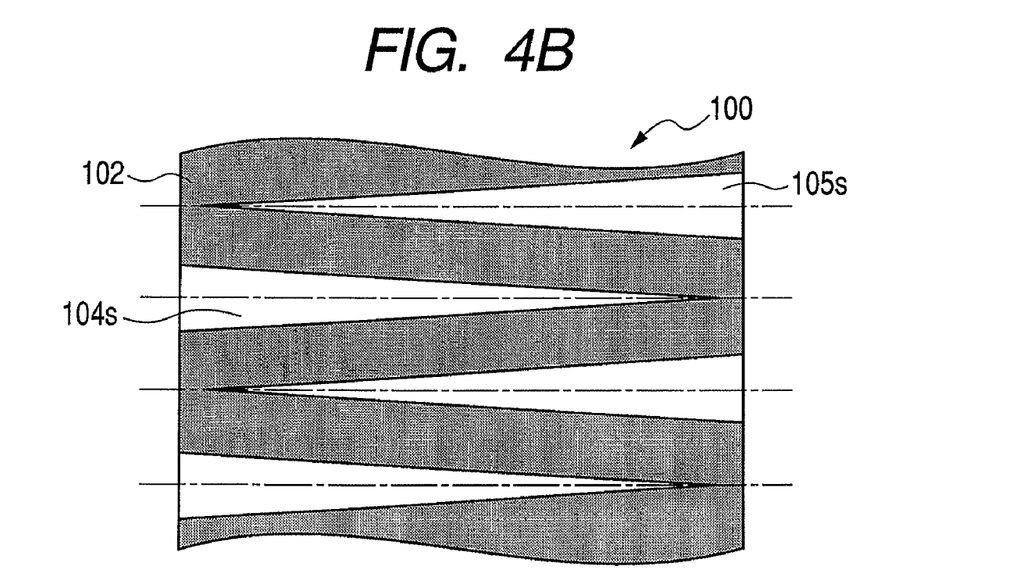

FIGS. 2A and 2B and FIGS. 3A and 3B illustrate the two groups of differential signal lines. However, three or more groups of differential signal lines 104 and 105 can be alternately disposed as illustrated in FIGS. 4A and 4B while keeping the relationship between the respective sizes described in the above embodiment. In this case, by alternately disposing the large-width side and the small-width side of the differential signal lines and by setting all the spacings between the differential signal lines to be constant, the differential impedances can be matched.

EXAMPLE 1

A simulation model corresponding to FIGS. 2A and 2B and FIGS. 3A and 3B wad made. Incidentally, the model was designed such that the differential impedances of the differential signal lines 104 and 105 were 100Ω. In the simulation model of Example 1, the line widths Wa2 and Wa1 of the lines 104a and 104b of the differential signal lines 104 were each gradually reduced from 0.15 mm to 0.10 mm in the arrow X direction. On the other hand, the line widths Wb2 and Wb1 of the lines 105a and 105b of the differential signal lines 105 were each gradually increased from 0.10 mm to 0.15 mm in the arrow X direction. The spacing Wga between the lines 104a and 104b and the spacing Wgb between the lines 105a and 105b were each constantly 0.15 mm. The two groups of differential signal lines had the same structure, and the spacing Ws between the differential signal line groups 104 and 105 was 0.5 mm. In this case, the entire width W of the two differential signal linegroups 104 and 105 was 1.3 mm. The thickness of the insulating layer was 0.1 mm, and the lengths of the differential signal lines were 50 cm.

The slit width Wsa of the GND layer formed below the differential signal lines 104 was gradually reduced from 0.15 mm to 0 mm in the arrow X direction. The slit width Wsb of the GND layer formed below the differential signal lines 105 was gradually increased from 0 mm to 0.15 mm in the arrow X direction.

Figure 6:
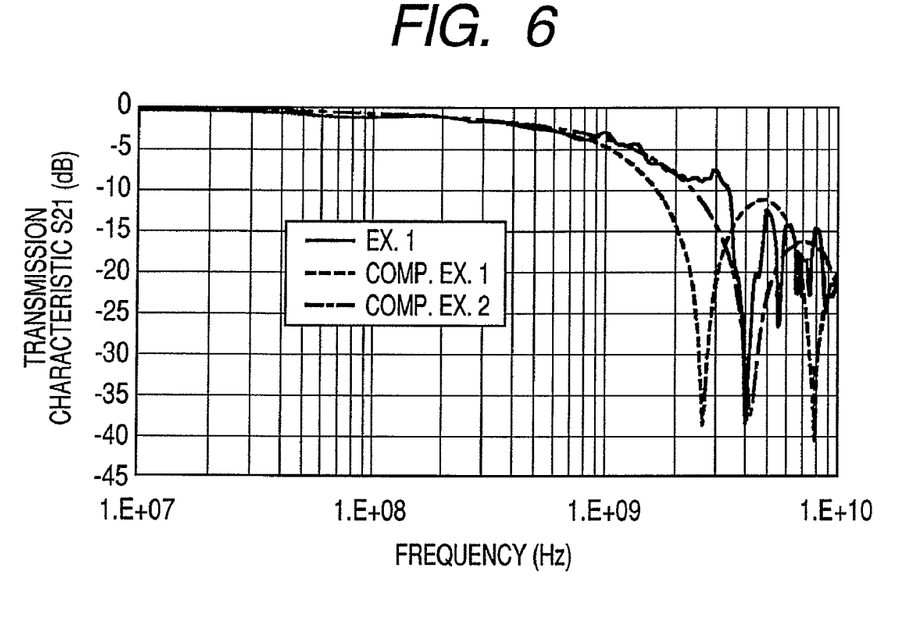
FIG. 6 is a graphical representation showing transmission characteristic S21 of Example 1 and Comparative Examples 1 and 2.

An electromagnetic field simulation and a circuit simulation of the simulation model of Example 1 were conducted, and the transmission characteristic S21 in the arrow X direction was calculated. FIG. 6 graphically represents the result. As the result of the simulations, the differential impedances of the differential signal lines 104 and 105 were about 100Ω.

Figure 7:
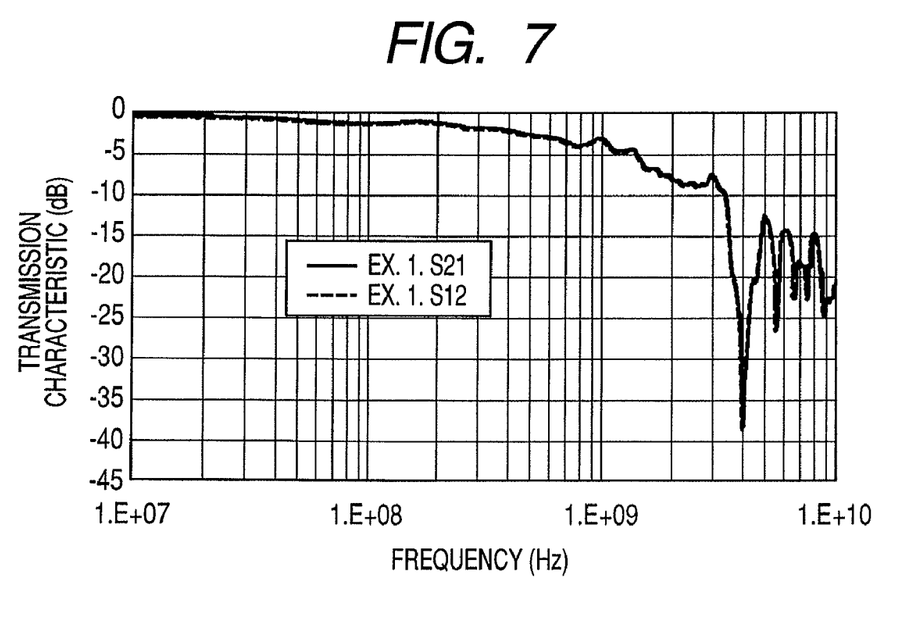
FIG. 7 is a graphical representation showing transmission characteristics S21 and S12 of Example 1.

FIG. 7 shows the above-mentioned transmission characteristic S21 and the transmission characteristic S12 in a direction opposite to the arrow X direction of the model of Example 1. The transmission characteristics S21 and S12 almost overlap each other in the graph of FIG. 7. In other words, the results show that the transmission characteristics when transmitted from the large-width side of the line are identical to those when transmitted from the small-width side of the lines, and the transmission characteristics do not change depending on the direction of the differential signal lines.

COMPARATIVE EXAMPLE 1

Figure 5A:
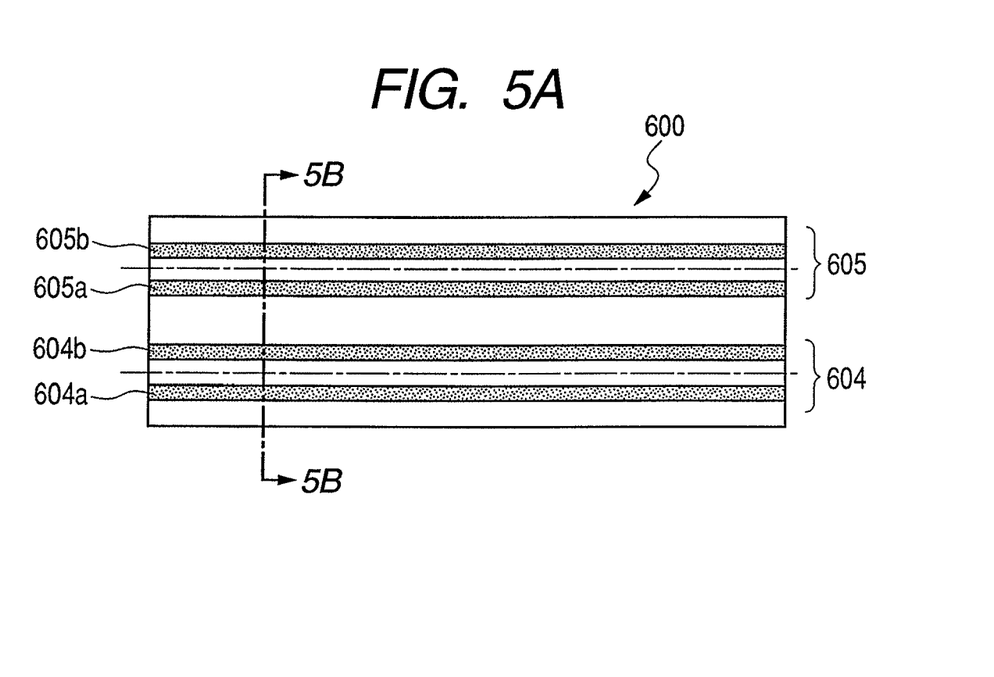
FIGS. 5A and 5B are plan and cross-sectional views respectively illustrating a printed wiring board according to Comparative Example 1.
Figure 5B:
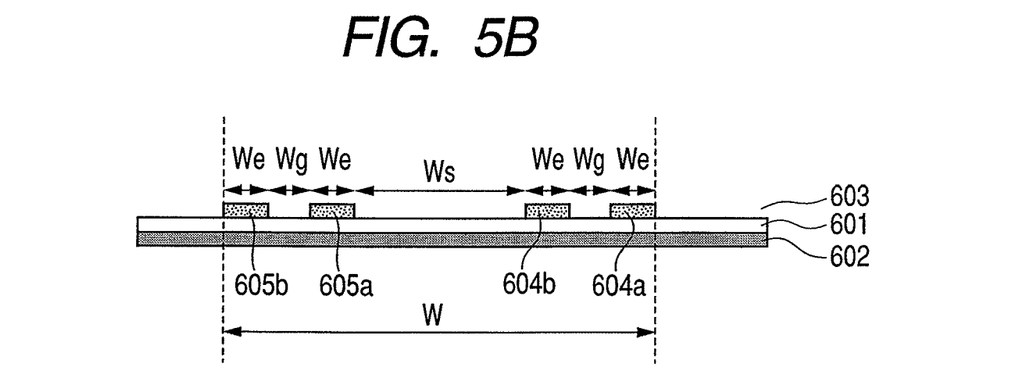

A simulation model of a printed wiring board of Comparative Example 1 will be described referring to FIGS. 5A and 5B. FIG. 5A is a plan view of the printed wiring board. FIG. 5B is a cross-sectional view of the printed circuit board 600 taken along line 5B-5B in FIG. 5A. The printed wiring board 600 has a structure in which a GND layer 602, an insulating layer 601, and a wiring layer 603 are stacked upon one another. The wiring layer 603 includes differential signal lines 604 and 605 disposed in parallel. Lines 604a and 604b of the differential signal lines 604 and lines 605a and 605b of the differential signal lines 605 all have the same line width We, and the width of each of the lines is constant in the line extending direction. The spacing between the lines 604a and 604b and the spacing between the lines 605a and 605b are the same value Wg, and the spacing is constant in the line extending direction. Further, the entire width W of the two differential signal line groups 604 and 605 is also constant in the line extending direction. Incidentally, the GND layer 602 below the wiring layer 603 has no slit formed.

To compare with Example 1, by using the same wiring area widths as Example 1, the simulation model of Comparative Example 1 was designed by employing (Equation 1) and (Equation 2) above such that the differential impedances were approximately 100Ω. The line widths We of the lines 604a, 604b, 605a, and 605b were 0.11 mm, and the spacing Wg between the lines 604a and 604b and the spacing Wg between the lines 605a and 605b were both 0.18 mm. The spacing Ws between the two differential signal line groups 604 and 605 was 0.5 mm. Accordingly, the entire width of the two differential signal line groups was 1.3 mm as with Example 1. Incidentally, the thickness of the insulating layer was 0.1 mm, the thickness t of the conductor was 0.035 mm, and the lengths of the differential signal lines were 50 cm.

An electromagnetic field simulation and a circuit simulation of the simulation model of Comparative Example 1 were conducted, and the transmission characteristic S21 was calculated. FIG. 6 graphically represents the result.

As shown in FIG. 6, in the case of Example 1, the transmission characteristic S21 has a resonance point at 4 GHz and is greatly degraded. In the case of Comparative Example 1, on the other hand, the transmission characteristic S21 has a resonance point near 2.7 GHz and is greatly degraded. Thus, it can be seen that the transmission characteristic S21 of Example 1 is greatly improved as compared with that of Comparative Example 1. In other words, when the same impedance characteristic is maintained in the same wiring area widths, the attenuation amount of the configuration of Example 1 is greatly reduced as compared with that of Comparative Example 1.

COMPARATIVE EXAMPLE 2

Next, a simulation model of Comparative Example 2 was made by following the same procedure as Comparative Example 1 with the exception that the line width We of the lines 604a, 604b, 605a, and 605b, the spacing Wg between the lines 604a and 604b and the spacing Wg between the lines 605a and 605b of the simulation model of Comparative Example 1 were changed. In Comparative Example 2, the wiring area widths was not considered, and the design was made such that the resonance point of transmission characteristic S21 was near 4 GHz as with Example 1.

In order to improve the transmission characteristic S21 as compared with that of Comparative Example 1, the width of each line only needs to be set larger. However, enlarging the width of the line reduces the single ended impedance. Therefore, in order to maintain the differential impedance at 100Ω, the spacing between differential signal lines needs to be increased. The simulation model of Comparative Example 2 was designed by employing (Equation 1) and (Equation 2) above such that the differential impedance was almost 100Ω. The width We of the lines 604a, 604b, 605a, and 605b was 0.14 mm, and the spacing Wg between the lines 604a and 604b and the spacing Wg between the lines 605a and 605b were both 0.4 mm. The spacing Ws between the two differential signal line groups 604 and 605 was 0.5 mm. Accordingly, the entire width W of the two differential signal groups was 1.86 mm as with Example 1. The thickness of the insulating layer was 0.1 mm, and the lengths of the differential signal lines were 50 cm.

An electromagnetic field simulation and a circuit simulation of the simulation model of Comparative Example 2 were conducted, and the transmission characteristic S21 was calculated. FIG. 6 graphically represents the result.

As shown in FIG. 6, the transmission characteristic S21 of Comparative Example 2 has a resonance point near 4 GHz, which is substantially similar to that of Example 1, and the attenuation amount is substantially the same. However, while the total wiring area widths of Example 1 is 1.3 mm, the total wiring area widths of Comparative Example 2 is 1.86 mm, which indicating a significant increase in the wiring area widths.

Table 1 summarizes the simulation parameters of Example 1 and Comparative Examples 1 and 2.

TABLE 1

| Simulation Parameters | | |
|---|---|---|
| Item | Parameter | |
| (Example 1) | | |
| Thickness of insulating layer | 0.1 mm | |
| Thickness of conductor (GND layer, differential signal line) | 0.035 mm | |
| Ws | 0.5 mm | |
| Wa | 0.1 mm (Minimum) | 0.15 mm (Maximum) |
| Wb | 0.1 mm (Minimum) | 0.15 mm (Maximum) |
| Wga | 0.15 mm | |
| Wgb | 0.15 mm | |
| Wsa | 0 mm (Minimum) | 0.6 mm |
| Wsb | 0 mm (Minimum) | 0.6 mm |
| W | 1.3 mm | |
| (Comparative Examples) | | |
| Thickness of insulating layer | 0.1 mm | |
| Thickness of conductor (GND layer, differential wiring layer) | 0.035 mm | |
| Slit width | 0.5 mm | |

TABLE 1-continued

| Simulation Parameters | |
|---|---|
| Item | Parameter |
| Case where occupation area is equal to that of Example 1 (Comparative Example 1) | |
| Line width | 0.11 mm |
| Line spacing | 0.18 mm |
| total wiring area widths | 1.3 mm |
| Case where transmission characteristic is almost similar to that of Example 1 (Comparative Example 2) | |
| Line width | 0.14 mm |
| Line spacing | 0.4 mm |
| total wiring area widths | 1.86 mm |

Second Embodiment

Figure 8A:
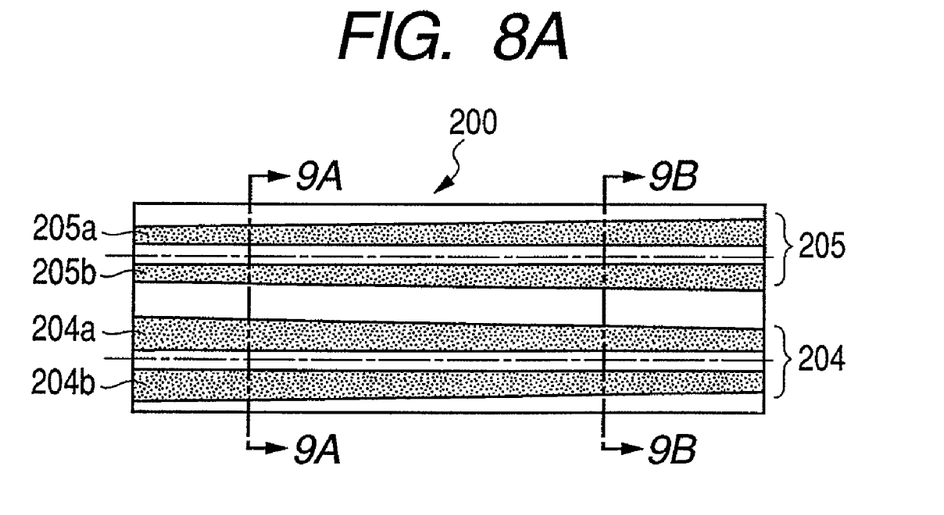
FIGS. 8A and 8B are plan views illustrating a printed wiring board according to Second Embodiment.
Figure 8B:
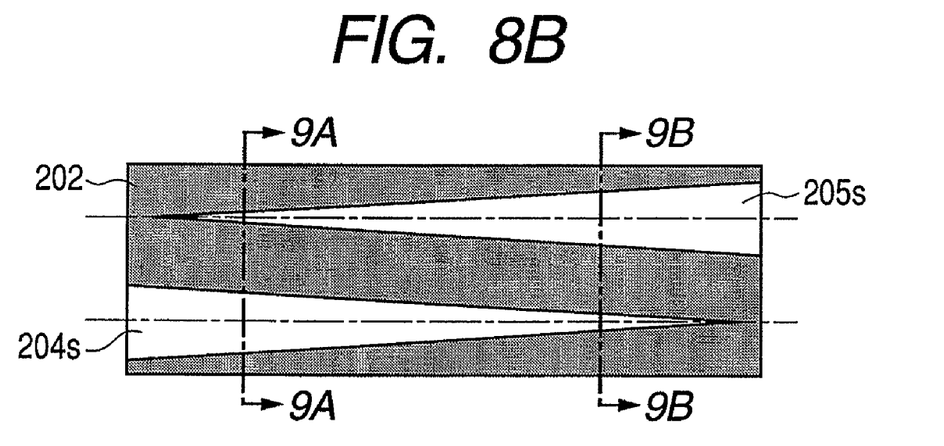
Figure 9A:
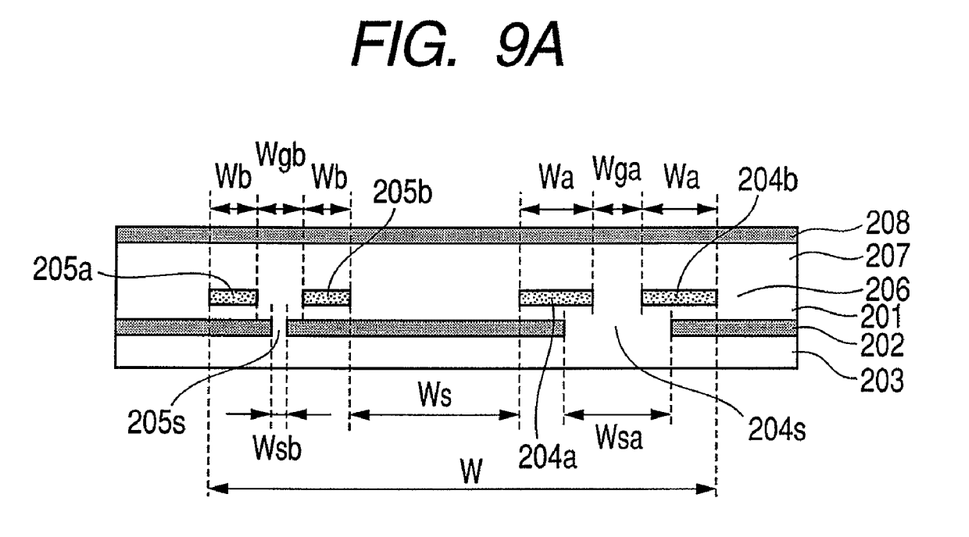
FIGS. 9A and 9B are cross-sectional views illustrating the printed wiring board according to Second Embodiment.
Figure 9B:
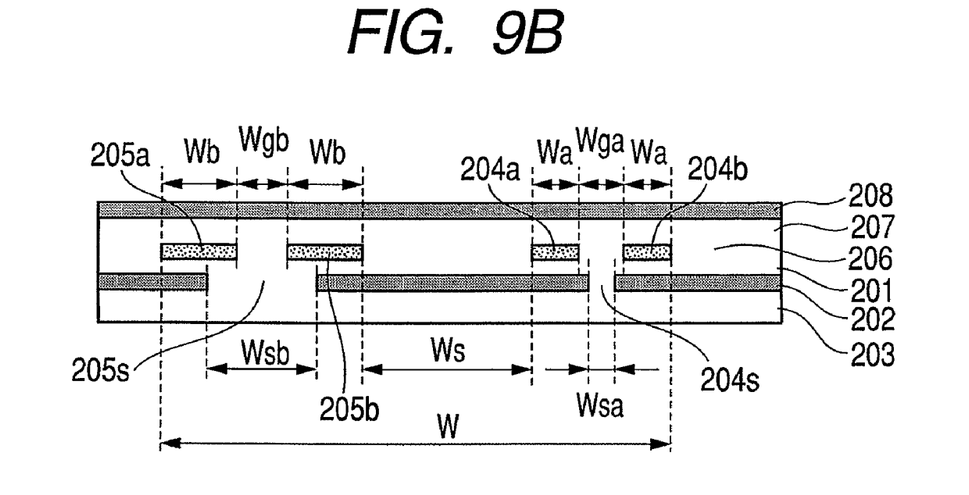

FIGS. 8A and 8B and FIGS. 9A and 9B illustrate Second Embodiment of the present invention. A printed wiring board 200 has a structure in which an insulating layer 203, a GND layer 202, an insulating layer 201, a differential signal wiring layer 206, and a GND layer 208 formed directly above the differential signal wiring layer 206 via an insulating layer 207 are stacked upon one another. FIG. 8A is a plan view of the differential signal wiring layer 206 of the printed wiring board 200, and FIG. 8B is a plan view of the GND layer 202. FIGS. 9A and 9B are cross-sectional views of the printed wiring board 200, respectively, taken along lines 9A-9A and 9B-9B in FIG. 8A. The differential signal wiring layer 206 includes differential signal lines 204 and 205.

The differential signal lines 204 include two lines 204a and 204b, and the differential signal lines 205 include two lines 205a and 205b. The GND layer 202 includes slits 204s and 205s as with First Embodiment. Unlike the case of the GND layer 202, the GND layer 208 includes no slits.

Second Embodiment is different from First Embodiment illustrated in FIGS. 2A and 2B and FIGS. 3A and 3B in that the GND layer 208 is arranged on the differential signal lines 204 and 205 via the insulating layer 207. Effects of the present invention can be realized not only by the microstrip structure of First Embodiment but also by the strip structure of Second Embodiment. Especially, from the standpoint of radiation noise, Second Embodiment is more effective.

Third Embodiment

Figure 10A:
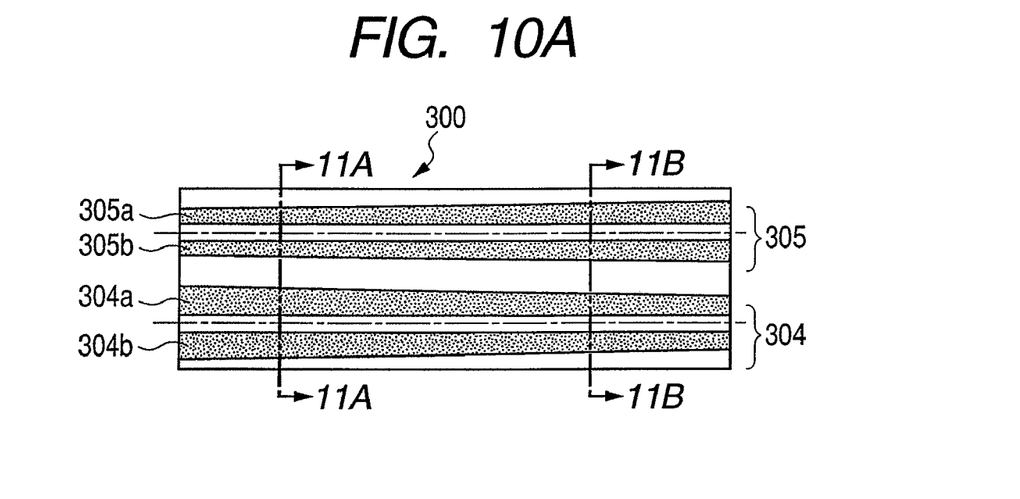
FIGS. 10A, 10B and 10C are plan views illustrating a printed wiring board according to Third Embodiment.
Figure 10B:
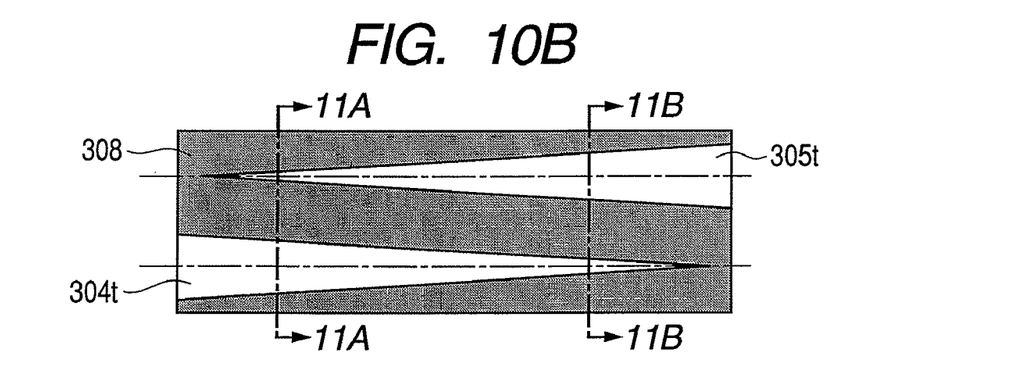
Figure 10C:
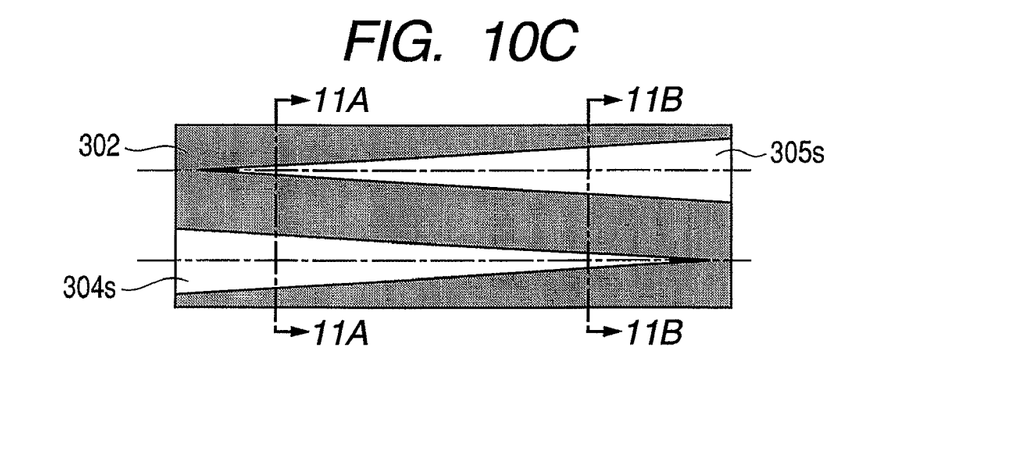
Figure 11A:
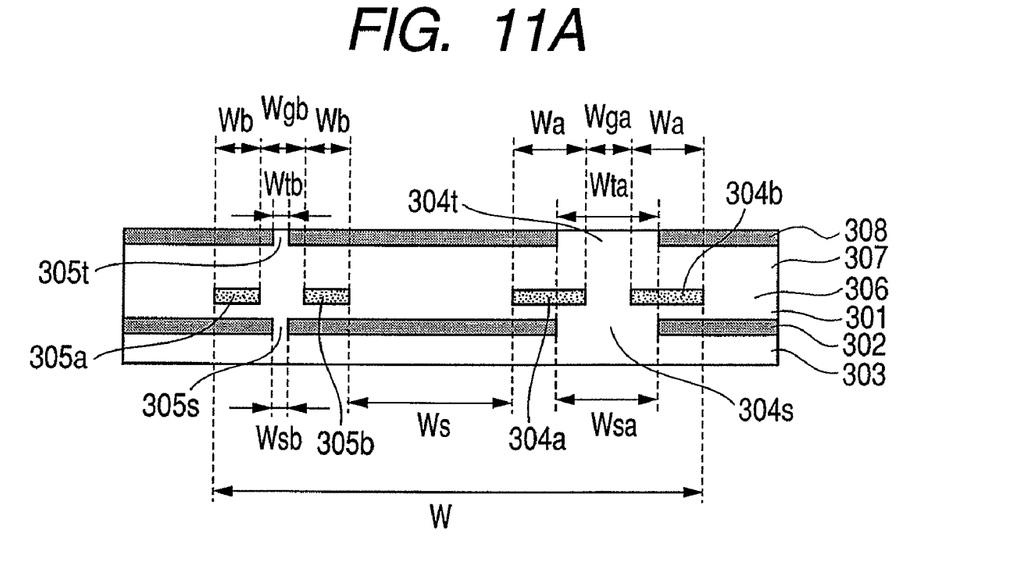
FIGS. 11A and 11B are cross-sectional views illustrating the printed wiring board according to Third Embodiment.
Figure 11B:
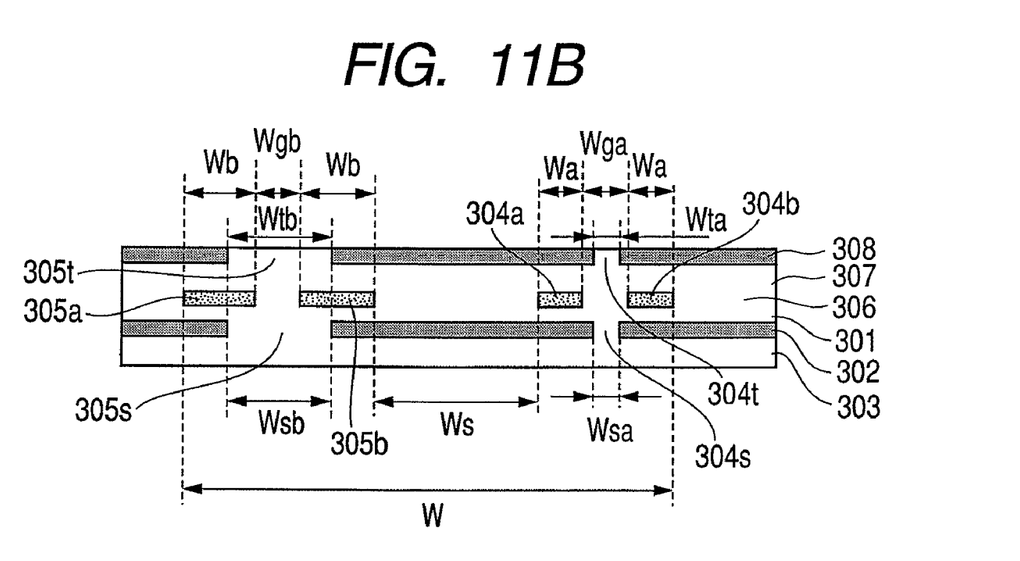

FIGS. 10A to 10C and FIGS. 11A and 11B illustrate Third Embodiment of the present invention. A printed wiring board 300 has a structure in which an insulating layer 303, a GND layer 302, an insulating layer 301, a differential signal wiring layer 306, and a GND layer 308 formed directly above the differential signal wiring layer 306 via an insulating layer 307 are stacked together. FIG. 10A is a plan view of the differential signal wiring layer 306 of the printed wiring board 300 when seen from above, and FIG. 10B is a plan view of the GND layer 308. FIGS. 11A and 11B are cross-sectional views of the printed wiring board 300 of FIG. 10A respectively taken along lines A-A and B-B. The differential signal wiring layer 306 includes differential signal lines 304 and 305.

The differential signal line 304 includes two lines 304a and 304b, and the differential signal line 305 includes two lines 305a and 305b. The GND layer 302 includes slits 304s and 305s as in the case of First Embodiment. The GND layer 308 also includes slits 304t and 305t as in the case of First Embodiment.

Third Embodiment is different from Second Embodiment illustrated in FIGS. 8A and 8B and FIGS. 9A and 9B in that the GND layer disposed above the differential signal lines 304 and 305 includes the slit 305s. An effect of the present invention is that impedance of the differential signal lines 304 and 305 is adjusted by the slits of the two GND layers sandwiching the differential signal lines 304 and 305. Accordingly, an adjustment range of impedance of the differential signal lines 304 and 305 is wide, enabling widths of the lines 304a, 304b, 305a, and 305b to be larger.

Fourth Embodiment

Figure 12A:
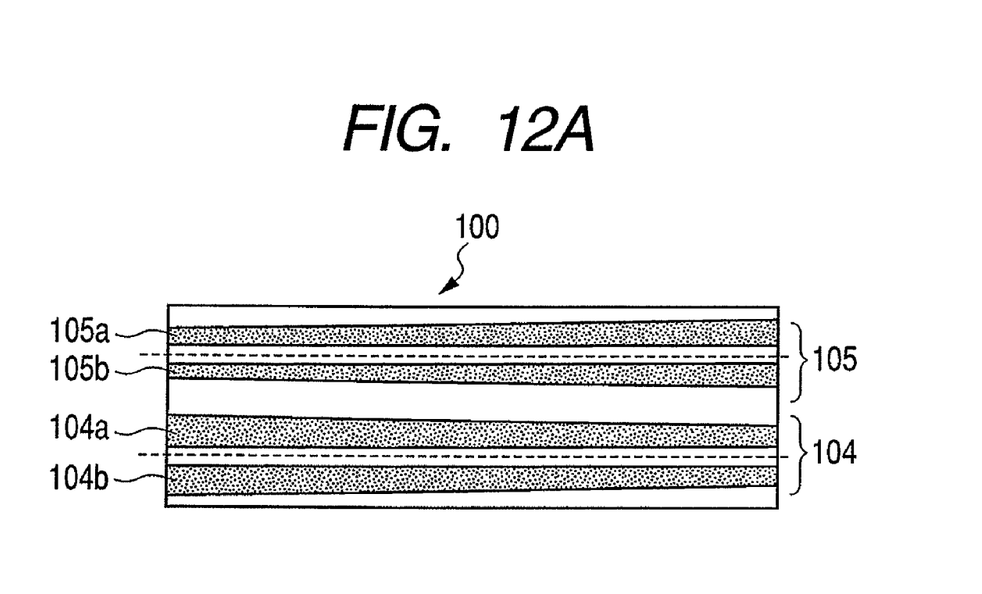
FIGS. 12A and 12B are cross-sectional views illustrating a printed wiring board according to Fourth Embodiment.
Figure 12B:
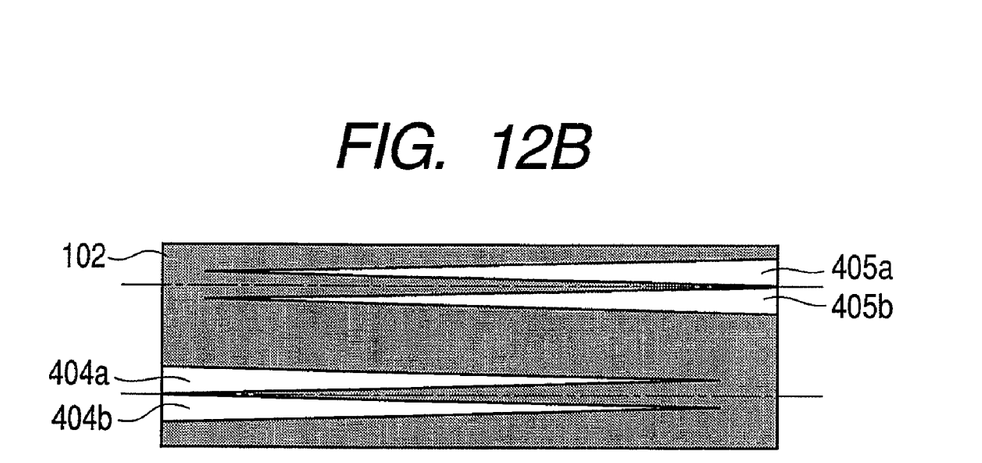

FIGS. 12A and 12B illustrate Fourth Embodiment of the present invention. In the embodiment, a difference from First Embodiment illustrated in FIGS. 2A and 2B is a structure of a slit formed in a GND layer 102. The same members of FIGS. 12A and 12B as those of FIGS. 2A and 2B are denoted by the same reference numerals, and description thereof will be omitted. As in the case of FIGS. 2A and 2B, in FIGS. 12A and 12B, an end of a left side of a differential signal line is a first area of a printed wiring board, and an end of a right side is a second area of the printed wiring board.

In FIGS. 12A and 12B, the GND layer 102 includes four slits 404a, 404b, 405a, and 405b. The slit 404a is formed directly below a line 104a of a signal wiring layer 106, and its opening width is larger as a width of the line 104a is increased from the first area toward the second area. The slit 404b is formed directly below the line 104b, and its opening width is larger as a width of the line 104b is increased from the first area toward the second area as in the case of the slit 404a.

The slit 405a is formed directly below a line 105a of the signal wiring layer 106, and its opening width is smaller as a width of the line 105a is reduced from the first area toward the second area. The slit 405b is formed directly below the line 105b, and its opening width is smaller as a width of the line 105b is reduced from the first area toward the second area as in the case of the slit 405a.

By forming a slit for each line as described above, differential impedance of the differential line can be more accurately adjusted.

According to the present invention, by suppressing signal attenuation and impedance mismatching, signal integrity can be secured. In this case, a wiring area of the printed wiring board is not increased. Thus, the printed wiring board and a semiconductor package can be miniaturized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-179174, filed Jul. 9, 2007 and 2008-136683, filed May 26, 2008, which are hereby incorporated by reference herein in their entirety.

What is claimed is:

1. A printed wiring board, comprising:
   a GND layer;
   an insulating layer; and
   a signal wiring layer adjacent to the GND layer via the insulating layer, the signal wiring layer having at least two groups of differential signal lines disposed in parallel, for interconnecting a first region and a second region of the printed wiring board,
   wherein two lines which constitute one group of the groups of differential signal lines are reduced in width at equal rates from the first region toward the second region, and a spacing between the two lines is constant,
   wherein another group of the groups of differential signal lines is disposed adjacent the one group of differential signal lines, two lines which constitute the another group of differential signal lines are increased in width at equal rates from the first region toward the second region, and a spacing between the two lines is constant, and
   wherein the GND layer has a first slit which is formed below the one group of differential signal lines and is reduced in opening width from the first region toward the second region, and a second slit which is formed below the another group of differential signal lines and is increased in opening width from the first region to the second region.

2. The printed wiring board according to claim 1, wherein the rate at which the two lines constituting the one group of differential signal line widths are reduced and the rate at which the two lines constituting the another group of differential signal line widths are increased are identical to each other, and wherein a total wiring area widths of the two groups of differential signal lines are constant extending between the first region and the second region.

3. The printed wiring board according to claim 2, wherein a rate at which the first slit is reduced in the opening width and a rate at which the second slit is increased in the opening width are equal to each other extending between the first region and the second region.

4. The printed wiring board according to claim 1, further comprising a GND layer disposed through an insulating layer on the differential signal wiring layer.

5. The printed wiring board according to claim 4, wherein the GND layer disposed above the differential signal wiring layer has a third slit which is formed above the one group of differential signal lines and is reduced in the opening width from the first region toward the second region, and a fourth slit which is formed above the another group of differential signal lines and is increased in the opening width from the first region to the second region.

6. A printed wiring board, comprising:
   a GND layer;
   an insulating layer; and
   a signal wiring layer adjacent to the GND layer via the insulating layer, the signal wiring layer having at least two groups of differential signal lines disposed in parallel, for interconnecting a first region and a second region of the printed wiring board,
   wherein two lines which constitute one group of the groups of differential signal lines are reduced in width at equal rates from the first region toward the second region, and a spacing between the two lines is constant,
   wherein another group of the groups of differential signal lines is disposed adjacent the one group of differential signal lines, two lines which constitute the another group of differential signal lines are increased in width at equal rates from the first region toward the second region, and a spacing between the two lines is constant, and
   wherein the GND layer has two slits which are formed below the one group of differential signal lines so as to correspond to the two lines constituting the one group of differential signal lines and are reduced in opening width from the first region toward the second region, and two slits which are formed below the another group of differential signal lines so as to correspond to the two lines constituting the another group of differential signal lines and are increased in opening width from the first region to the second region.

7. A printed circuit board, comprising:
a printed wiring board, and
a first electronic component and a second electronic component each mounted on the printed wiring board,
the printed wiring board, comprising:
a GND layer;
an insulating layer; and
a signal wiring layer adjacent to the GND layer via the insulating layer, the signal wiring layer having at least two groups of differential signal lines disposed in parallel, for interconnecting the first electronic component and the second electronic component mounted on the printed wiring board,
wherein two lines which constitute one group of the groups of differential signal lines are reduced in width at equal rates from the first electronic component toward the second electronic component, and a spacing between the two lines is constant,
wherein another group of the groups of differential signal lines is disposed adjacent the one group of differential signal lines, two lines which constitute the another group of differential signal lines are increased in width at equal rates from the first electronic component toward the second electronic component, and a spacing between the two lines is constant, and
wherein the GND layer has a first slit which is formed below the one group of differential signal lines and is reduced in opening width from the first electronic component toward the second electronic component, and a second slit which is formed below the another group of differential signal lines and is increased in opening width from the first electronic component to the second electronic component.

* * * * *